United States Patent
Alba et al.

(10) Patent No.: US 7,288,008 B2
(45) Date of Patent: Oct. 30, 2007

(54) NONLITHOGRAPHIC METHOD OF DEFINING GEOMETRIES FOR PLASMA AND/OR ION IMPLANTATION TREATMENTS ON A SEMICONDUCTOR WAFER

(75) Inventors: Simone Alba, Milan (IT); Carmelo Romeo, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 191 days.

(21) Appl. No.: 11/089,942

(22) Filed: Mar. 25, 2005

(65) Prior Publication Data

US 2005/0239291 A1    Oct. 27, 2005

(30) Foreign Application Priority Data

Apr. 1, 2004    (EP) .................. 04425243

(51) Int. Cl.
*H01L 21/302* (2006.01)
(52) U.S. Cl. .............. 439/736; 438/706; 438/710; 430/312
(58) Field of Classification Search ......... 438/706, 438/710, 712, 736; 430/312, 314; 156/345.39
See application file for complete search history.

(56) References Cited

U.S. PATENT DOCUMENTS

| | | | |
|---|---|---|---|
| 3,971,684 A | 7/1976 | Muto | 156/13 |
| 4,448,865 A | 5/1984 | Bohlen et al. | 430/5 |
| 4,661,203 A * | 4/1987 | Smith et al. | 438/725 |
| 6,924,493 B1 * | 8/2005 | Leung | 250/492.21 |
| 2002/0058400 A1 * | 5/2002 | Suguro et al. | 438/514 |

FOREIGN PATENT DOCUMENTS

WO    02/14951    2/2002

OTHER PUBLICATIONS

Weidenmuller et al., Heavy Ion Projection Beam System for Material Modification at High Ion Energy, Journal of Vacuum Science and Technology B (Microelectronics and Nanometer Structures) AIP for American Vacuum SOC USA, vol. 20, No. 1, Jan. 2002, pp. 246-249.

Ruchhoeft et al., Fabrication of Silicon Stencil Masks with Vitreous Carbon Ion-Absorbing Coatings, Journal of Vacuum Science and Technology B: Microelectronics Processing and Phenomena, American Vacuum Society, New York, NY, US, vol. 16, No. 6, Nov. 1998, pp. 3599-3601.

Shibata et al., Litography-Less Ion Implantation Technology for Agile FAB, 2001 IEEE International Symposium on Semiconductor Manufacturing Conference Proceedings (ISSM 2001) San Jose, CA, Oct. 8-10, 2001, pp. 113-116.

* cited by examiner

*Primary Examiner*—Lan Vinh
(74) *Attorney, Agent, or Firm*—Lisa K. Jorgenson; Allen, Dyer, Doppelt, Milbrath & Gilchrist, P.A.

(57) ABSTRACT

A method for defining geometries in a semiconductor wafer supported on a plate electrode in a processing chamber includes forming a reusable refractory coated laminar mask. The reusable refractory coated laminar mask is formed by defining the geometries in a laminar mask substrate, forming apertures through the laminar mask substrate, and forming a layer of refractory material over at least one surface of the laminar mask substrate. The reusable refractory coated laminar mask is positioned over the semiconductor wafer. Treating of the semiconductor wafer is performed through the apertures of the reusable refractory coated laminar mask. The treating may be plasma etching or ion etching.

19 Claims, 6 Drawing Sheets

Etching

Removal of
the Resist

NONLITHOGRAPHIC METHOD OF DEFINING GEOMETRIES FOR PLASMA AND/OR ION IMPLANTATION TREATMENTS ON A SEMICONDUCTOR WAFER

FIELD OF THE INVENTION

The invention relates in general to semiconductor devices, and in particular, to fabrication techniques for defining geometries for plasma and/or ion implantation treatments of a semiconductor wafer supported on the surface of a plate electrode of a reactor.

BACKGROUND OF THE INVENTION

Advances in photolithographic techniques have been determinant in the success of the chip industry by allowing a continuous scaling down in the physical dimensions of the structures of integrated components, and consequently, in the cost of semiconductor devices.

These results have been achieved by using radiation of smaller and smaller wavelengths ($\lambda$), and increasingly large numerical apertures (NA) of the optical system by implementing techniques based on phase contrast lithographic masks (PFM) and off-axis or annular illumination and use of high performance resist. The resolution of the optical system is proportional to the ratio ($\lambda$/NA).

Basically, photolithographic processing implies the following steps:
1. realization of either a binary (chromium and quartz) or a phase-contrast lithographic mask;
2. deposition of a layer of resist over the semiconductor wafer (commonly a slice of monocrystalline silicon);
3. exposing of the resist through the photolithographic mask for transferring the image thereof (usually focused by a projection system of lenses) on the photoresist;
4. development of the exposed photoresist;
5. performance of a plasma etch and/or an ion implanting step through the openings of the developed resist mask;
6. removal of the resist; and
7. dimensional checking of the defined features.

FIGS. 1a, 1b, 1c, 1d, 1e and 1f depict the processing steps 2, 3, 4, 5 and 6. The ability of reducing the physical dimensions of the lithographically defined features on the wafer is limited by the technological ability of lithographically defining smaller and smaller details.

To this end, electron lithography techniques have been developed. In case of the PREVAIL technique from IBM, the radiation source produces an electron beam which illuminates a stencil mask, and the electrons passing through the apertures of the mask are focused by a projection system of lenses (operating at a 4× reduction) onto the resist layer. The advantage of this system rests on the relatively small wavelength of the electron beam, and therefore, on an inherent possibility of allowing enhanced levels of definition, and therefore, compactness of the integrated structures.

A different approach that is being followed is referred to as direct writing of the resist by an electron brush without the use of any mask. According to this approach, a focused electron beam produces the image in the resist. Of course, this means that the various features of the semiconductor device are defined one by one by the electron brush. Although resolution is very high, the method is characterized by an extreme slowness (4-8 wafers/hour) and its productivity will probably remain relatively low. Notwithstanding this intrinsic drawback, many manufacturers are favoring this technology for supporting the development of future generation devices.

Besides the cost of apparatus and infrastructure, advances in the technological limits of lithographic processings implies an ever increasing complexity of the processing operations that become more and more time consuming.

SUMMARY OF THE INVENTION

The need and/or usefulness of an alternative more cost effective technique for defining geometries for plasma and/or ion implantation treatments of a semiconductor wafer for fabricating semiconductor devices of enhanced compactness is evident.

According to the present invention, an object of the invention is to provide a method of successfully defining nanometric geometries for plasma and/or ion implantation treatments of a semiconductor wafer that is more cost effective than the known approaches discussed above.

It is possible to achieve higher productivity and cost savings by avoiding the need of lithographically defining the required geometries on the semiconductor wafer, but by defining the geometries by direct writing on a resist layer with a focused electron beam (i.e., an electron brush).

The method of the invention may be defined as substantially non-lithographic. A reusable laminar mask of a material that is mechanically self-sustaining, lithographically definable and dry etchable is fabricated. The fabrication may be performed by lithographically defining on a mechanically self-sustaining laminar substrate of a dry etchable material the desired geometries, and subsequently dry etching it to produce the desired apertures through the thickness of the substrate.

After removing the resist mask used for lithographically defining and etching the apertures through the laminar substrate, a layer of a refractory material having a substantial resistance to plasmas is deposited over the surface of the defined and etched laminar substrate that will eventually face toward the plasma or the ion source. Preferably, the laminar substrate should be electrically conductive because, according to preferred embodiments of the invention, the reusable mask may be fed with RF power during use.

The fabricated mask (or mask electrode) is placed in contact or at a relatively small distance that may be between 1 and 5, or even more millimeters, from the surface of an ordinarily supported wafer to be processed. If the mask is held spaced from the surface of the wafer, it is preferably coupled to an RF power source.

Injection of RF energy on a suspended mask electrode of an electrically conductive substrate material effectively contrasts diversion of ions from substantially straight trajectories upon passing through the apertures of the mask electrode in their travel toward the surface of the wafer underneath the suspended mask.

The plasma etching and/or ion implantation treatment is conducted on the wafer through the apertures of the mask (or mask electrode) that is protected from the etching action of the plasma by its refractory coating.

The mask or mask electrode, protected by the layer of refractory material, lasts for a large number of wafers before needing to be replaced by a new (virgin) mask electrode. Preliminary tests indicate that a coated mask electrode can last for a number of wafers on the order of several hundred up to well over one thousand wafers.

The cost-effectiveness of the method results from the re-usability of the lithographically defined mask or mask electrode for treating a large number of wafers. This avoids the burden of lithographically defining each wafer to be processed. The method reduces or eliminates the repetitive masking processings of the wafers.

The structure of the reactors that are normally used for conducting plasma etching treatments and for conducting ion implantation treatments of the wafer may remain substantially unchanged. The wafer or the wafers to be processed are commonly placed on a plate electrode which may be provided with thermostatically controlled elements to maintain the wafer at a most appropriate and substantially constant temperature during the processing, and with common mounting means of the wafer that may be mechanical or electrostatic (i.e., an electrostatic chuck device). The wafer or the wafers are introduced in the reactor chamber without having been subjected to any masking process. The definition of the desired geometries is achieved by interposing the plasma resistant laminar mask or mask electrode between the plasma or the ion source and the wafer resting on the plate electrode of the reactor.

A mask electrode may be suspended at a certain distance, which may generally be between 1 and 5 millimeters from the surface of the wafer, by appropriately stiff supporting structures or pillars resting on the wafer surface, and connected to an RF source. Only the ions that pass through the openings of the mask electrode reach the underlying wafer resting on the plate electrode of the reactor.

Alternatively, the mask electrode may be placed directly in contact with the surface of the wafer to be processed. In this case, RF energy may be fed to the mask electrode either through a direct electrical connection to an RF source, or the RF source may be electrically connected to the plate electrode of the reactor onto which the wafer rests in a customary fashion. RF power may be capacitively transferred to the mask electrode for enhancing undeflected straight impinging trajectories of ions passing through the openings of the mask electrode.

In a less preferable case of a coated reusable mask having a substantially non-conductive or dielectric substrate, the most appropriate way of using it is to place it directly in contact with the surface of the wafer to be processed. For purposes of the invention, the thickness of the laminar mask or mask electrode should be relatively small, such as generally between 30 and 60 µm.

The protective coating of refractory material deposited over the mask substrate confers to the mask resistance to the etching action of the plasma (in case of a plasma etch treatment of the wafer through the mask) and/or to the impinging dopant ions that are often highly energetic (in case of an ion implantation treatment on the wafer). $Y_2O_3$, $SiO_2$ and W may be satisfactorily used as refractory protective coatings.

Yttrium oxide ($Y_2O_3$) deposited by any suitable known technique such as, for example, by laser ablation, ion beam or sputtering, has proven to be an excellent protective material of the substrate of the mask or mask electrode. The thickness of an $Y_2O_3$ coating may generally be between 2 and 10 µm. Even thicker coatings may be used.

The electrically conductive substrate may be of any conductive material capable of being fabricated in the form of a sufficiently thin lamina or foil, and to be lithographically definable and dry etchable to produce geometrical features of nanometric size. Silicon, carbon, copper and gold are examples of suitable electrically conductive substrate materials.

Preferably, the conductive substrate of a refractory coated mask electrode of the invention is a slice of doped monocrystalline silicon. For this purpose, an ordinary silicon wafer may be grounded or planarized to reduce its thickness down to about 40 µm, which is suitable for forming the laminar electrically conductive substrate of a mask electrode. Monocrystalline silicon has a thermal expansion coefficient that is orders of magnitude smaller than that of a metal or metal alloy. This is a very desirable characteristic in terms of dimensional stability of the lithographically defined mask electrode apertures. Moreover, its lithographic definition to open the desired apertures therethrough may be carried out according to well established plasma etching steps.

DETAILED DESCRIPTION OF THE PREFERRED EMBODIMENTS

Figure 1A:
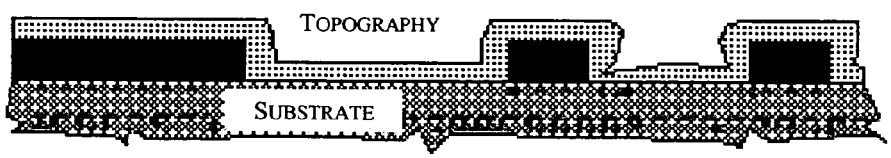
FIGS. 1a to 1f illustrate a traditional plasma etching processing of a wafer according to the prior art.

The main steps of a traditional plasma etching processing of a wafer are depicted in FIGS. 1a to if. FIG. 1a is a partial cross section of a generic wafer composed of a semiconductor substrate and onto which a certain feature has already been defined over its surface. A layer of a material (e.g., an isolation oxide layer) has been deposited on the semiconductor substrate and the certain features, and which is to be patterned.

Figure 1B:
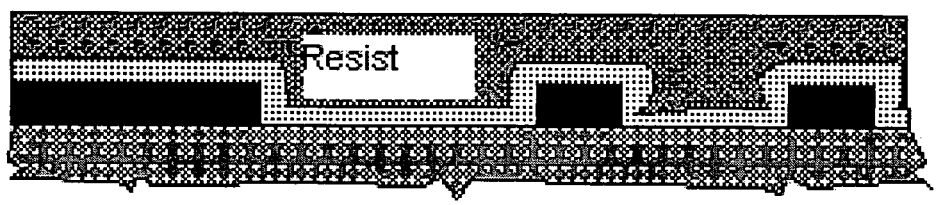
Figure 1C:
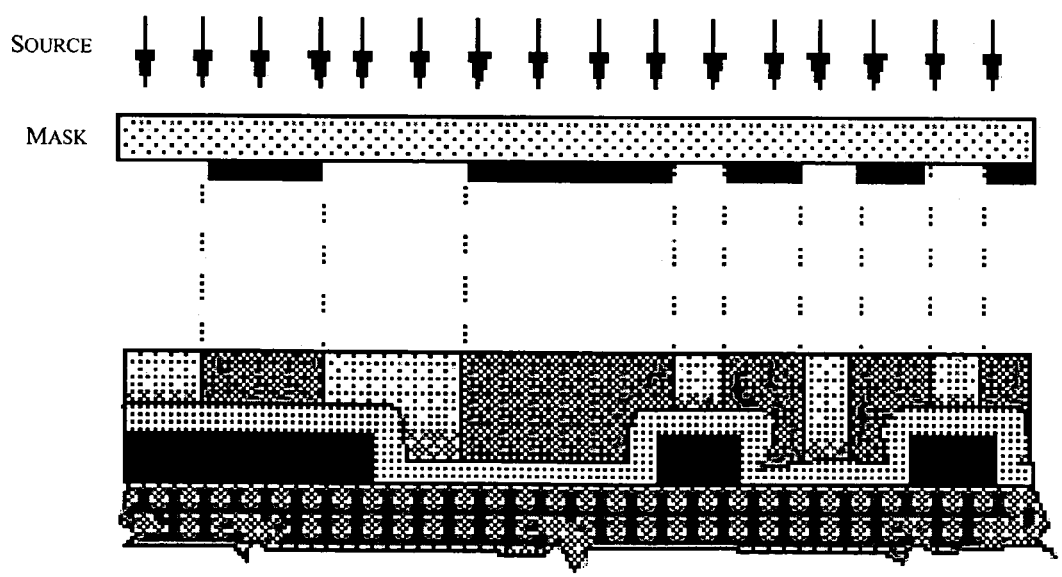
Figure 1D:
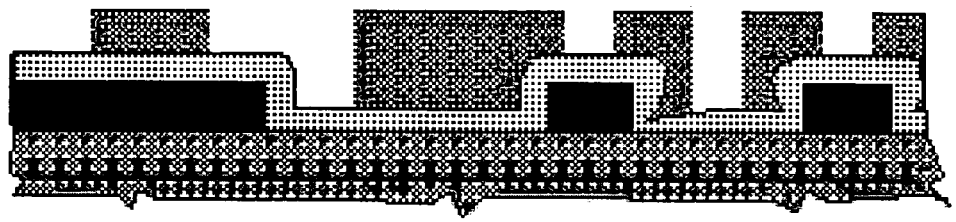

FIG. 1b shows a layer of photoresist deposited over the surface of the wafer. FIG. 1c depicts the phase of exposing the resist through a photolithographic mask, and producing a latent image of the photolithographic mask in the resist using a projection optical system. FIG. 1d shows the aspects of the resist mask formed on the wafer surface following the development of the exposed resist.

Figure 1E:
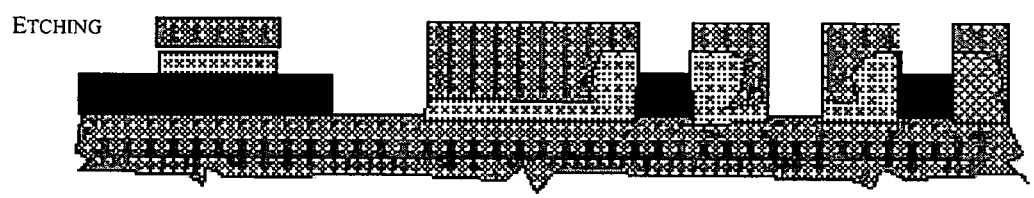
Figure 1F:
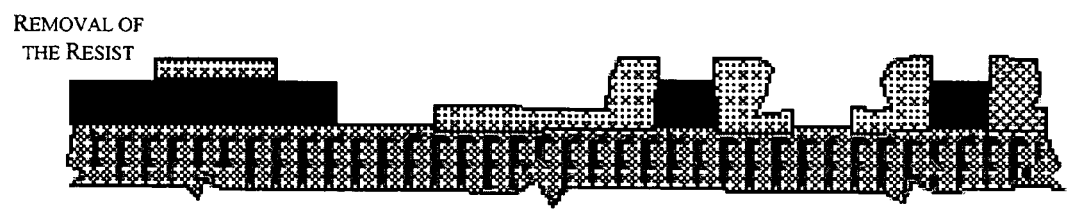
Figure 2:
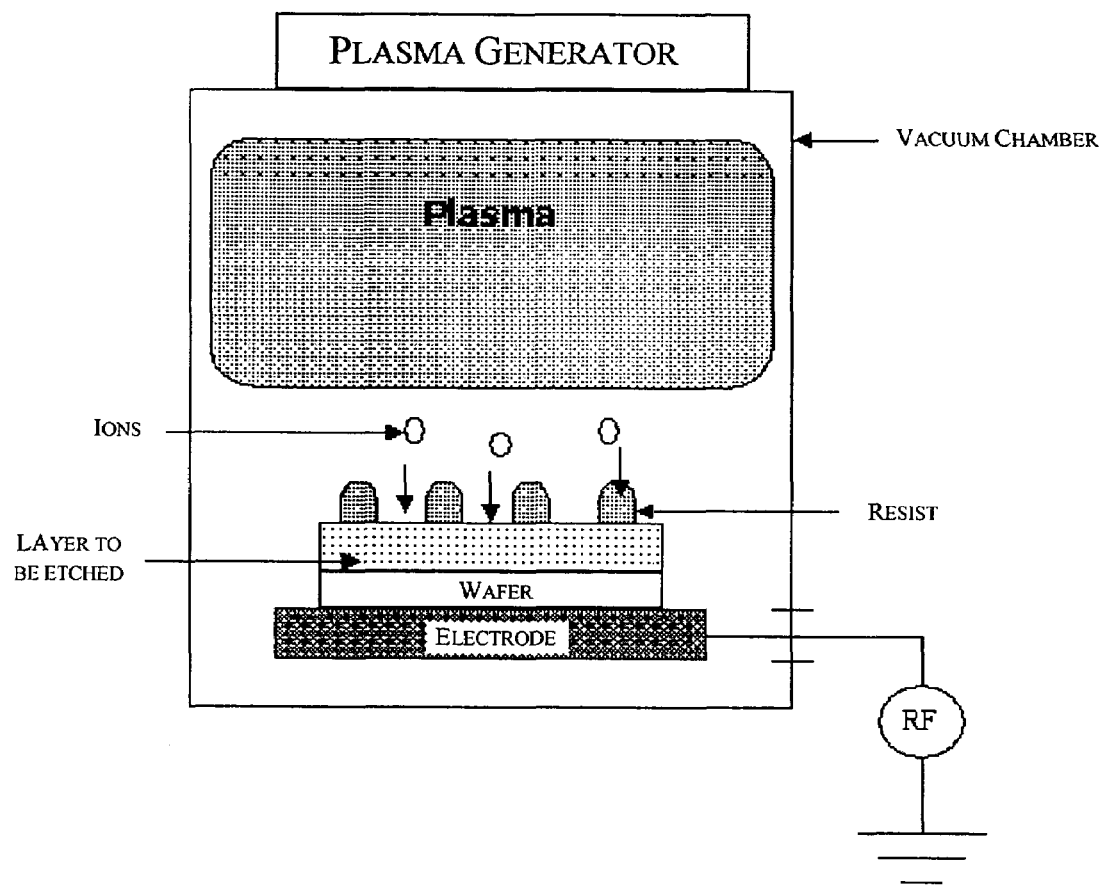
FIG. 2 schematically illustrates a plasma etching processing of a wafer through a resist mask, conducted according to the prior art in an evacuated chamber of a plasma etch reactor.

FIG. 1e shows the carrying out of a plasma etch through the resist mask openings of the underlying top layer of the wafer. FIG. 1f shows the new topography assumed by the wafer after the plasma etch of the top layer. The plasma etching processing through a resist mask, conducted according to the prior art in an evacuated chamber of a plasma etch reactor, is schematically shown in FIG. 2.

The presence of the resist over the surface of the wafer prevents the etching from occurring underneath the resist. This helps to accomplish definition of the desired geometries through the thickness of the top layer of the wafer to be patterned.

A plasma generator produces a plasma within the evacuated chamber. Ions are attracted toward the wafer that is placed on a base electrode of the reactor to which RF energy is fed from an outside source. This is done to promote attraction of the ions responsible for an etching action on the material of the top layer to be patterned through the openings in the resist mask.

Figure 3:
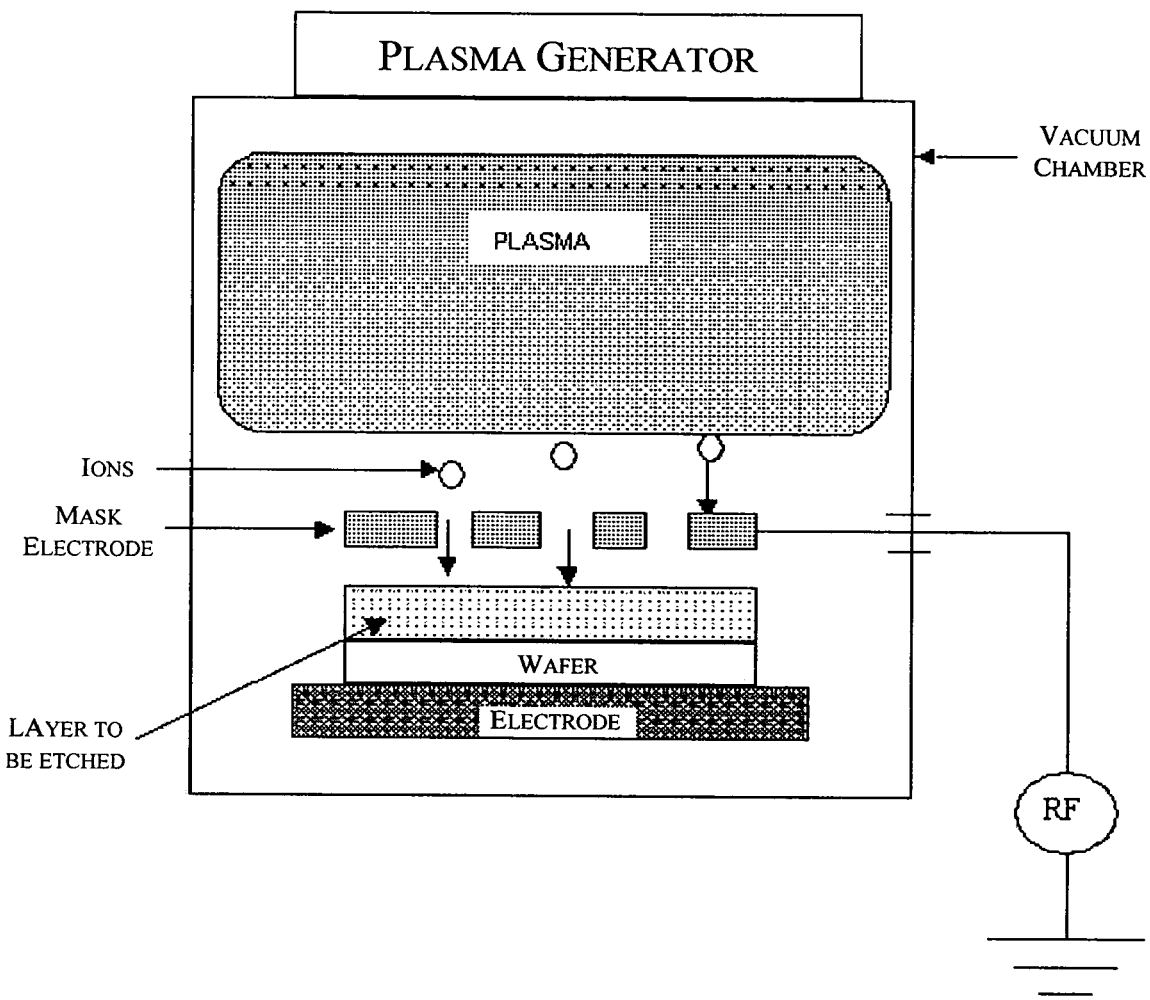
FIG. 3 is a schematically illustrates a phase of plasma etching over a wafer through the openings of a mask according to a first embodiment of the invention.

FIG. 3 illustrates a first embodiment of the invention. Differently from the prior art arrangement of FIG. 2, the wafer is introduced in the plasma etch reactor without being masked by a photolithographically defined resist mask.

On the contrary, between the surface of the wafer and the plasma generated in the evacuated chamber of the reactor by an appropriate source, there is a reusable refractory coated mask electrode suspended at a certain distance from the surface of the wafer. This distance is generally between 1 and 5 millimeters. RF power is fed to the mask electrode by direct connection to an external RF source.

The refractory coating of the mask electrode facing the plasma effectively protects the geometries of the openings through the conductive substrate of the mask electrode from being degraded by the action of the etching ions at an uneconomically fast rate. Only the ions that pass through the openings defined in the mask electrode impinge on the top layer of the wafer to be etched. This practically transfers the image of the mask electrode to the etched top layer of the wafer in a one-to-one magnification ratio.

Figure 4:
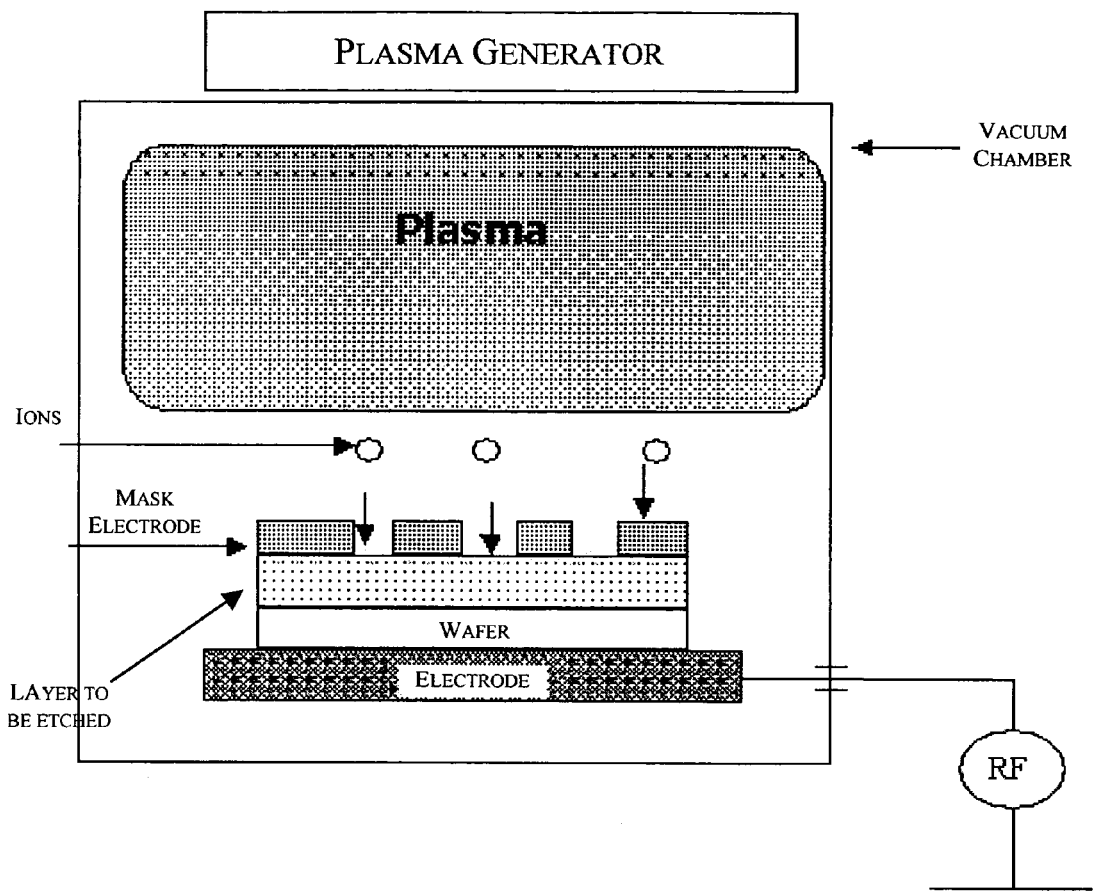
FIG. 4 schematically illustrates the phase of plasma etching according to an alternative embodiment of the invention.

According to an alternative embodiment of the invention, instead of supporting the mask electrode at a certain distance (1 to 5 millimeters) above the surface of the wafer to be etched or implanted, a reusable refractory coated mask may be placed directly on the surface of the wafer, as depicted in FIG. 4.

As shown in FIG. 4, in case the reusable refractory coated mask is fabricated from a conductive substrate, it is even possible to feed RF power to such a mask electrode. This is done not by directly connecting it to the external RF source, but by feeding the RF energy to the base electrode of the reactor. The RF power is capacitively transferred to the mask electrode placed in contact with the wafer resting on the base electrode of the reactor.

Figure 5:
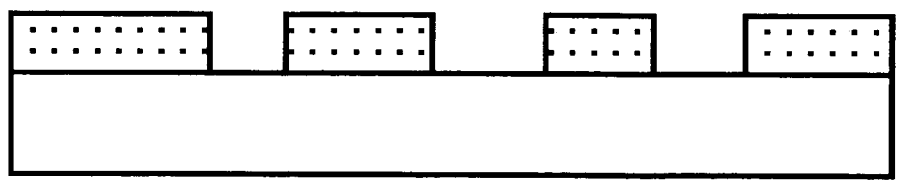
FIG. 5 illustrates a profile of the plasma etched wafer at the end of the process according to the invention.

FIG. 5 schematically shows the geometry of the profile that is imparted to the wafer by the plasma etch step conducted according to the present invention. This is accomplished without masking the wafer with a resist mask.

Figures 6A, 6B:
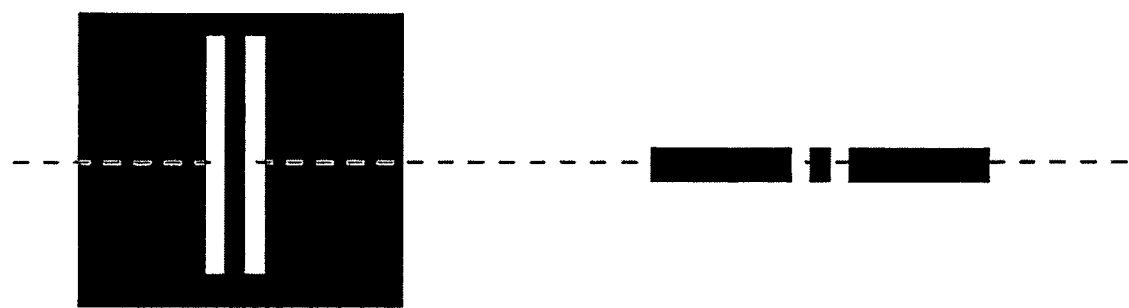
FIGS. 6a and 6b illustrate a sample reusable mask according to the invention.

FIGS. 6a and 6b are respectively a layout and a cross-sectional view of a geometrical detail defined by producing openings through the reusable refractory coated mask or mask electrode of the invention. The dark regions represent solid portions of the mask that do not permit the passage of the ions attracted toward the underlying wafer. The white portions represent the openings through the thickness of the reusable refractory coated mask through which the ions may pass and reach the underlying wafer to be either etched by the impinging ions, or implanted by purposely accelerated (highly energetic) ions of a dopant.

Beside being significantly resistant to the impinging ion, the reusable refractory coated mask or mask electrode should possess good mechanical stability (strength) sufficient to be self-sustaining and easily handled, and a low thermal expansion coefficient to ensure a sufficient dimensional stability of the defined patterns. The thickness of the mask electrode may be generally between 30 and 60 µm.

Any conductive material satisfying the above-mentioned requisites would be a candidate material from which the mask-electrode may be made. Silicon, carbon, copper, tungsten and gold may be used as a conductive electrode substrate or in a multilayer arrangement of two or more.

A silicon slice is a preferred candidate because, besides being possible to ground or planarize an ordinary slice, for those employed as semiconducting substrates of the wafers, down to a thickness of about 40 µm and even less, lithographical technologies for defining nanometric geometries on silicon are well established. It is possible to proceed with the dry etching of the silicon to the extent of opening it to obtain the desired mask openings with a very high dimensional precision.

A mask-electrode substrate of silicon has a relatively small thermal expansion coefficient compared to metallic materials. Even more advantageous is the practical identical thermal expansion characteristics with the wafers to be processed.

It is even possible to preliminarily deposit a layer of silicon oxide, copper, gold or carbon on the bottom face of the silicon slice to be lithographically defined. The dry etching through the full thickness of the silicon slice would be stopped on the underlying layer of silicon oxide, copper, gold or carbon, after which the chemistry of the dry etch and/or the reactor used may be changed to proceed with the etching of the silicon oxide, copper, gold or carbon layer. This is under suitably selective conditions with respect to the silicon already opened. Such a composite (laminated) mask electrode substrate is then provided with a protective coating of a refractory, plasma resistant material. This material may be, for example, yttrium oxide, carbon or tungsten, and is deposited either on the surface of the silicon, or alternatively, on the surface of the opened oxide or metal layer, or on both.

Of course, the face coated with the protective refractory layer will be facing the plasma or the ion source of the reactor in which the wafers will be treated. This is done while using a fabricated reusable mask or mask electrode.

The relative thinness of the reusable refractory coated mask or mask electrode may require the use of a supporting structure when the mask is to be suspended at a certain distance from the surface of the wafer, according to the embodiment of FIG. 3.

This structure (not shown in the figures) may be in the form of a grid-like rest, including thin rigid members spanning across the width of the mask electrode onto which the latter rests.

A small thermal expansion coefficient of the material with which the mask electrode is made reduces the extent of dimensional charges that may occur because of temperature changes within the reactor chamber. Metallic materials are generally more sensitive to these effects then monocrystalline silicon. However, even in case of a metallic substrate of the mask electrode, these effects may be controlled by associating to the mask electrode a thermostatically controlled heat sink structure.

In case the reusable refractory coated mask is physically laid and eventually electrostatically anchored onto the wafer to be processed, the physical contact between the two objects may be exploited for keeping them at the same temperature.

An advantage of a reusable refractory coated mask or mask electrode made of a thinned silicon slice is that a substantial identity of the thermal expansion coefficients of both the mask-electrode and the wafer will decisively enhance the dimensional stability of the defined features.

For the case of a reusable, refractory coated mask of silicon, the following analysis gives a quantitative evaluation of the problem of dimensional stability as a function of variations of the temperature of the mask electrode.

Assumptions:
Thermal coefficient of expansion of silicon: $\alpha = 3 \times 10^{-6}$ °K
Temperature variation: $\Delta T = 50$° K Specifications:
Admitted dimensional tolerance: $\Delta CD=+5$ nm$-10$ nm
Overlay: $+15$ nm$-30$ nm Layouts:
Array of contacts: Spacing between adjacent contacts: $L_0<60$ nm
Isolated contacts: Distance=1000 nm Calculation:
$\Delta L$=stretching of the spacings (distance between two adjacent contacts) induced by temperature variation $\Delta L/L^0 = \alpha \Delta T = 3 \times 10^{-6} \; 50 = 15 \times 10^{-5}$ Array of Contacts:
$\Delta L = \alpha \Delta T \; L_0 = 15 \times 10^{-5} \; 60 \text{ nm} = 90 \times 10^{-3}$; Negligible with respect to the specification.

Isolated Contact
$\Delta L = \alpha \Delta T \; L_0 = 15 \times 10^{-5} \; 1000 \text{ nm} = 15 \times 10^{-2}$; Negligible with respect to the specification.

Remarks:
a) Since the mask is normally at uniform temperature, there will not be any stresses induced by local overheatings.
b) An eventual small expansion will imply a correspondingly small shift of the contact opening window during the etching process.

Possible problems of overlay may be prevented by restricting the mask opening. As far as the need of correctly aligning the mask electrode with the wafer to be processed is concerned, it may be addressed in the same way and with the same techniques that are used in the common lithographic procedures according to known fabrication methods.

For example, for devices formed in a 0.18 µm technology, an alignment in the neighborhood of 60 nm for the most critical levels of definition is required. State of the art lithographic apparatuses are provided with sophisticated alignment devices based on interferometric or on image recognition techniques.

Of course, also for the approach of the invention, the alignment may be effected using available lithographic techniques. Typically, the reusable, refractory coated mask or mask electrode will include alignment signs that will need to coincide with signs present on the wafer. The actual alignment may be carried out either within the reactor chamber or in a separate auxiliary chamber connected to the reactor (load locking). In the latter case, the alignment system does not need to conform to the limited spaces available within the treatment chamber and will be more easily adapted to the actual geometry.

Of course, the use of a reusable, refractory coated mask or mask electrode according to the invention for defining plasma etch or ion implantation regions in a processed wafer will face the well known donuts problem, intrinsic to the use of stencil type masks. This can be overcome, as already done in the EPL technique and in x-ray lithography, by employing data processing techniques of the geometrical data of the patterns (fracturing of the device) for defining the geometries of suitably complementary mask electrodes.

Especially in case of use of a reusable, refractory coated mask spaced from the surface of the wafer, the ions, after passing through the openings of the mask, could be sensitive to a repulsive action because of their positive charge. This determines a spreading out of the ion trajectories, and a consequential loss of definition of the geometries to be transferred from the mask to the wafer. By the ability of feeding RF power to a conductive substrate of the mask electrode, a substantial collimation of the ions passing through the openings of the mask electrode is ensured. This is ensured by the fact that an electron current of an intensity equal to the ion current flows in the mask electrode. This effectively neutralizes the effect of the spatial charge of the ions (re: "Principles of Plasma Discharge and Material Processing" by M. A. Lieberman and A. J. Lichtenberg, Wiley & Sons 1994, pages 358 et seq.).

Of course, to promote and obtain practically vertical etch profiles as required by modern microelectronics technologies and high etch selectivities with respect to underlying layers of the wafer, it will be necessary to optimize the processing parameters. For example, the types and flow rates of the gas used for the processing, powers, pressures and the like may be optimized. However, such an optimization will be similar to one that is normally necessary to carry out traditional dry etch processes.

That which is claimed is:

1. A method for defining geometries in a semiconductor wafer in a processing chamber, the semiconductor substrate being supported on a surface of a plate electrode, the method comprising:
    forming a reusable refractory coated laminar mask on a surface of the semiconductor wafer by
        defining geometries in a laminar mask substrate corresponding to the geometries to be defined in the semiconductor wafer,
        forming apertures through the laminar mask substrate, and
        forming a layer of refractory material over at least one surface of the etched laminar mask substrate;
    positioning the reusable refractory coated laminar mask over the semiconductor wafer;
    coupling an RF power source to the plate electrode so that coupling between the RF power source and the reusable refractory coated laminar mask is based upon a capacitive coupling therebetween for causing ions to be accelerated through the apertures in the reusable refractor coated laminar mask; and
    treating the semiconductor wafer through the apertures in the reusable refractory coated laminar mask.

2. A method according to claim 1, wherein the laminar mask substrate comprises a dielectric.

3. A method according to claim 1, wherein the layer of refractory material comprises at least one of yttrium oxide, carbon, silicon oxide and tungsten.

4. A method according to claim 1, further comprising controlling a temperature of the reusable refractory coated laminar mask for preserving a one-to-one magnification ratio of transfer of the geometries to the semiconductor wafer.

5. A method according to claim 1, wherein the laminar mask substrate has a thickness in a range of about 30 to 60 µm.

6. A method according to claim 1, wherein the layer of plasma resistant refractory material has a thickness in a range of about 2 to 10 µm.

7. A method according to claim 1, wherein the treating comprises a dry etching of at least a top layer of the semiconductor wafer.

8. A method according to claim 1, wherein the treating comprises at least one of plasma etching and ion etching.

9. A method according to claim 1, wherein the laminar mask substrate comprises an electrically conductive laminar mask substrate.

10. A method according to claim 9, wherein the electrically conductive laminar mask substrate comprises at least one of silicon, carbon, copper and gold.

11. A method for defining geometries in a semiconductor wafer in a processing chamber, the method comprising:
   forming a reusable refractory coated laminar mask by
      defining geometries in a laminar mask substrate corresponding to the geometries to be defined in the semiconductor wafer,
      forming apertures through the laminar mask substrate, and
      forming a layer of refractory material over at least one surface of the laminar mask substrate;
   positioning the reusable refractory coated laminar mask over the semiconductor wafer so that the reusable refractory coated laminar is supported parallel to and at a distance from the semiconductor wafer;
   coupling an RF power source only to the reusable refractory coated laminar mask for causing ions to be accelerated through the apertures therein; and
   treating the semiconductor wafer through the apertures in the reusable refractory coated laminar mask.

12. A method according to claim 11, wherein the layer of refractory material comprises at least one of yttrium oxide, carbon, silicon oxide and tungsten.

13. A method according to claim 11, further comprising controlling a temperature of the reusable refractory coated laminar mask for preserving a one-to-one magnification ratio of transfer of the geometries to the semiconductor wafer.

14. A method according to claim 11, wherein the laminar mask substrate has a thickness in a range of about 30 to 60 µm.

15. A method according to claim 11, wherein the layer of plasma resistant refractory material has a thickness in a range of about 2 to 10 µm.

16. A method according to claim 11, wherein the treating comprises a dry etching of at least a top layer of the semiconductor wafer.

17. A method according to claim 11, wherein the treating comprises at least one of plasma etching and ion etching.

18. A method according to claim 11, wherein the laminar mask substrate comprises an electrically conductive laminar mask substrate.

19. A method according to claim 18, wherein the electrically conductive laminar mask substrate comprises at least one of silicon, carbon, copper and gold.

* * * * *

UNITED STATES PATENT AND TRADEMARK OFFICE
CERTIFICATE OF CORRECTION

PATENT NO. : 7,288,008 B2  Page 1 of 1
APPLICATION NO. : 11/089942
DATED : October 30, 2007
INVENTOR(S) : Alba et al.

It is certified that error appears in the above-identified patent and that said Letters Patent is hereby corrected as shown below:

| | |
|---|---|
| Cover page (75) | Delete: "Milan"<br>Insert: -- Milano -- |
| Column 4, Line 22 | Delete: "is a schematically"<br>Insert: -- schematically -- |
| Column 4, Line 37 | Delete: "if"<br>Insert: -- 1f -- |
| Column 7, Line 12 | Delete: "L°"<br>Insert: -- $L_o$ -- |
| Column 7, Line 15 | Delete: "90x10$^{-3}$"<br>Insert: -- 90x10$^{-3}$ nm -- |

Signed and Sealed this

Twelfth Day of August, 2008

JON W. DUDAS
*Director of the United States Patent and Trademark Office*